US010454476B2

United States Patent
Bang et al.

(10) Patent No.: US 10,454,476 B2
(45) Date of Patent: Oct. 22, 2019

(54) CALIBRATED BIASING OF SLEEP TRANSISTOR IN INTEGRATED CIRCUITS

(71) Applicant: Intel Corporation, Santa Clara, CA (US)

(72) Inventors: Suyoung Bang, Hillsboro, OR (US); Muhammad Khellah, Tigard, OR (US); Charles Augustine, Portland, OR (US); Pascal Meinerzhagen, Hillsboro, OR (US); Minki Cho, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/145,598

(22) Filed: Sep. 28, 2018

(65) Prior Publication Data

US 2019/0044512 A1 Feb. 7, 2019

(51) Int. Cl.
*H03K 19/00* (2006.01)

(52) U.S. Cl.
CPC ..... *H03K 19/0016* (2013.01); *H03K 19/0013* (2013.01)

(58) Field of Classification Search
CPC .............. H03K 19/0016; H03K 19/0013
See application file for complete search history.

(56) References Cited

U.S. PATENT DOCUMENTS 9,871,507 B1 * 1/2018 Zyuban ............ H03K 17/161

OTHER PUBLICATIONS

Shin'ichiro Mutoh et al., "1-V power supply high-speed digital circuit technology with multithreshold-voltage CMOS," IEEE J. Solid-State Circuits, vol. 30, No. 8, Aug. 1995, pp. 847-854.
Hiroshi Kawaguchi et al., "A CMOS Scheme for 0.5V supply voltage with pico-ampere standby current", IEEE International Solid State Circuits Conf. (ISSCC) Dig. Tech. Papers, Feb. 1998, pp. 192-193.
James Kao et al.,"Subthreshold Leakage Modeling and Reduction Techniques," Proc. IEEE/ACM International Conference on Computer-aided Design, Nov. 2002, 8 pages.
T.Y. Chan et al., "The impact of gate-induced drain leakage current on MOSFET scaling," International Electron Devices Meeting, Dec. 1987, pp. 718-721.
Suyoung Bang et al., "Reconfigurable sleep transistor for GIDL reduction in ultra-low standby power systems," Proc. IEEE Custom Integr. Circuits Conf. (CICC), Sep. 2012, pp. 1-4.

* cited by examiner

*Primary Examiner* — Seokjin Kim
(74) *Attorney, Agent, or Firm* — Schwabe, Williamson & Wyatt, P.C.

(57) ABSTRACT

Embodiments include apparatuses, methods, and systems associated with biasing a sleep transistor (also referred to as a power gate transistor) in an integrated circuit. The sleep transistor may be coupled between a load circuit and a power rail, the sleep transistor to be on in an active mode to provide the supply voltage to the load circuit, and to be off in a sleep mode to disconnect the load circuit from the power rail. The bias circuit may be coupled to the gate terminal of the sleep transistor to provide a calibrated gate voltage to the gate terminal during the sleep mode. The calibrated gate voltage may be based on a subthreshold leakage current and a gate-induced drain leakage (GIDL) current of the sleep transistor or a replica sleep transistor designed to replicate the leakage current of the sleep transistor. Other embodiments may be described and claimed.

33 Claims, 5 Drawing Sheets

CALIBRATED BIASING OF SLEEP TRANSISTOR IN INTEGRATED CIRCUITS

FIELD

Embodiments of the present invention relate generally to the technical field of electronic circuits, and more particularly to biasing of sleep transistors in integrated circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Many electronic circuits, such as processors, use power gating to turn off circuit blocks that are not in use, thereby saving power. The circuit may include a sleep transistor coupled between the power supply and the circuit block and/or between the ground terminal and the circuit block to selectively disconnect the circuit block. In advanced metal-oxide-semiconductor field effect transistor (MOSFET) processes with thin oxide thickness (e.g., small $T_{ox}$), and/or in circuit conditions with large drain-source voltage, gate-induced drain leakage (GIDL) current is a significant leakage component of total standby current.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
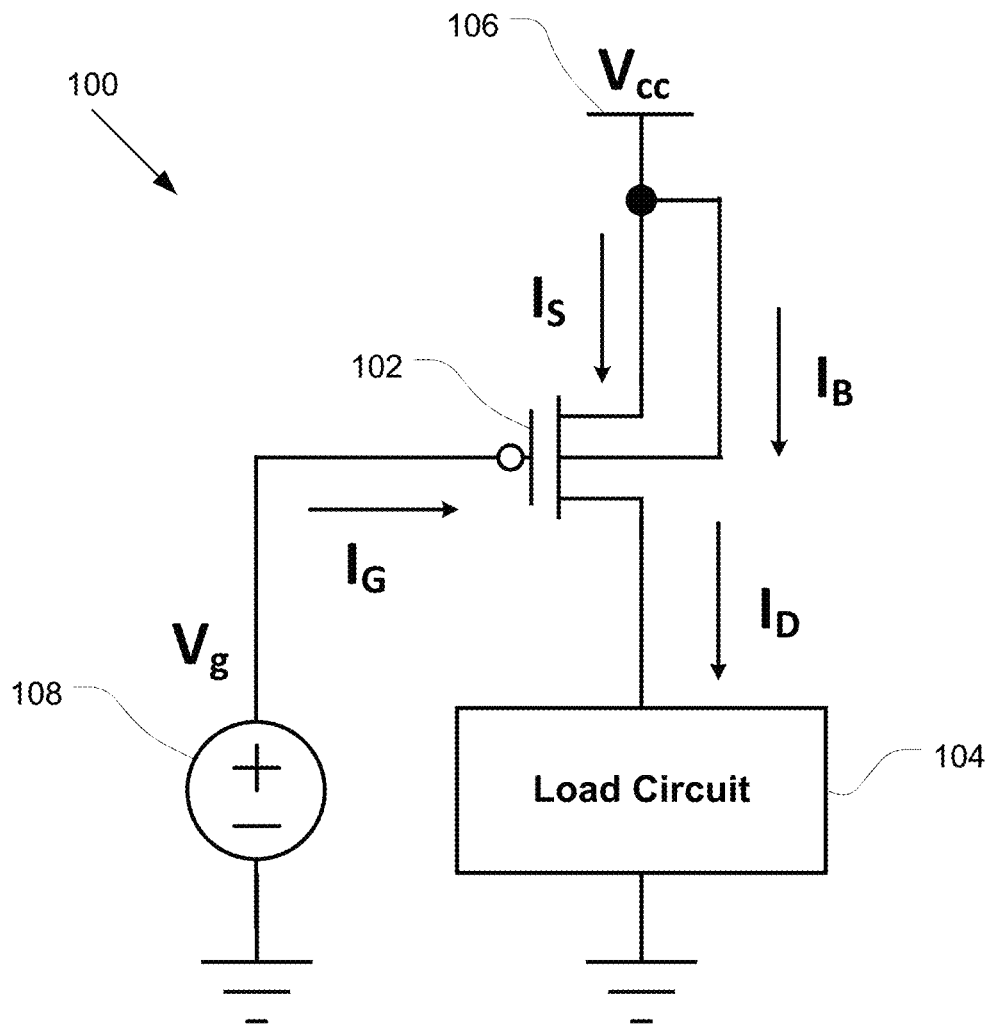
FIG. 1 illustrates a circuit including a sleep transistor coupled between a load circuit and a power supply rail, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Described herein are apparatuses, methods, and systems associated biasing a sleep transistor (also referred to as a power gate transistor) in an integrated circuit. The sleep transistor may be coupled between a load circuit and a power rail, the sleep transistor to be on in an active mode to provide the supply voltage to the load circuit, and to be off in a sleep mode to disconnect the load circuit from the power rail. The bias circuit may be coupled to the gate terminal of the sleep transistor to provide a calibrated gate voltage to the gate terminal during the sleep mode. The calibrated gate voltage may be based on a subthreshold leakage current and a gate-induced drain leakage (GIDL) current of the sleep transistor. For example, in some embodiments, the bias circuit may include a replica sleep transistor designed to replicate the leakage current of the sleep transistor. The bias circuit may measure a total leakage current of the replica sleep transistor at a plurality of voltage levels of a gate voltage provided to the replica sleep transistor, wherein the total leakage current includes the subthreshold leakage current and the GIDL current (e.g., plus a junction leakage current) of the replica sleep transistor. The bias circuit may set the calibrated gate voltage to a calibrated voltage level that has a lowest measured total leakage current among the plurality of voltage levels.

In some embodiments, the source terminal of the replica sleep transistor may be coupled to an internal node of the bias circuit, and the bias circuit may further include a capacitor coupled between the internal node and ground. The bias circuit may further include a controller to charge the internal node (e.g., charge the capacitor) to an initial voltage, and a voltage detector to detect when a voltage at the internal node falls below a threshold voltage. The controller may measure the total leakage current of the replica sleep transistor based on a time period that elapses for the voltage at the internal node to fall below the threshold voltage. The length of the time period may be inversely proportional to the total leakage current of the replica sleep transistor (e.g., a longer time period indicates a lower total leakage current).

FIG. 1 illustrates a circuit 100 including a sleep transistor 102, in accordance with various embodiments. The sleep transistor 102 may be coupled between a load circuit 104 (also referred to as circuit block 104) and a power supply rail 106 that is to receive a supply voltage (Vcc). For example, a drain terminal of the sleep transistor 102 may be coupled to the load circuit 104, and a source terminal of the sleep transistor 102 may be coupled to the power supply rail 106. A voltage generator 108 may be coupled to the gate terminal of the sleep transistor 102 to provide a gate voltage (e.g., bias voltage) to the gate terminal to turn the sleep transistor on (e.g., to provide the supply voltage Vcc to the load circuit 104 during an active mode of the circuit 100) and to turn the sleep transistor 102 off (e.g., to disconnect the load circuit 104 from the supply voltage Vcc during a sleep mode of the circuit 100).

In some embodiments, the sleep transistor 102 may be a p-type transistor, such as a p-type metal-oxide-semiconductor field-effect transistor (p-type MOSFET, also referred to as PMOS). In other embodiments, the sleep transistor 102 may be another suitable type of transistor. Additionally, while the sleep transistor 102 is shown in FIG. 1 to be coupled between the load circuit 104 and the power supply rail 106, other embodiments may additionally or alternatively include a sleep transistor coupled between the load circuit 104 and ground to power gate the load circuit 104. For example, an n-type transistor (e.g., n-type MOSFET, also referred to as NMOS) may be coupled between the load circuit 104 and ground.

FIG. 1 further illustrates a source current $I_S$, a drain current $I_D$, a body current $I_B$, and a gate current $I_G$. The source current $I_S$ may be attributed to subthreshold current ($I_{sub}$) flowing from the source to drain of the sleep transistor 102 (e.g., when the sleep transistor 102 is off). The body current $I_B$ may be attributed gate-induced drain leakage (GIDL) current ($I_{GIDL}$) plus junction current ($I_j$) flowing from body to drain of the sleep transistor 102. The drain current ID may be the sum of the source current $I_S$ and $I_B$. The value of these currents may be different across different process, voltage, and/or temperature (PVT) conditions.

In various embodiments described herein, the voltage generator 108 may adjust a voltage level of the gate voltage based on the subthreshold current $I_{sub}$ (e.g., source current $I_S$) and the GIDL current $I_{GIDL}$ (e.g., the GIDL current plus the junction current $I_j$, which may correspond to the body current $I_B$). For example, the total leakage current of the sleep transistor 102 (or of a replica sleep transistor) may be measured at a plurality of voltage levels of the gate voltage, where the total leakage current includes the subthreshold current $I_{sub}$ and the GIDL current $I_{GIDL}$ (e.g., plus the junction current $I_j$). The voltage level of the calibrated gate voltage may be selected as the voltage level of the plurality of voltage levels that provided the lowest measured total leakage current. In some embodiments, a closed loop control circuit may be used to measure the total leakage current at the plurality of voltage levels and calibrate the gate voltage, e.g., as described further below. In some embodiments, the voltage level of the calibrated gate voltage may be adjusted so that the subthreshold current is approximately equal (within 10%) to the GIDL current plus the junction current (e.g., $I_{sub} \cong I_{GIDL} + I_j$).

Accordingly, the voltage level of the gate voltage may change with different PVT conditions. In some embodiments, the gate voltage may be adjustable to be less than the supply voltage Vcc under some conditions and greater than the supply voltage Vcc under other conditions. For example, for typical (TT) and fast (FF) PVT corners, the gate voltage may be greater than Vcc to reduce the subthreshold leakage current $I_{sub}$, since the subthreshold leakage current is greater than the GIDL current plus junction current under those PVT conditions when gate voltage Vg=Vcc. However, for slow (SS) PVT corner, the gate voltage may be less than Vcc, because the GIDL current plus junction current may be greater than the subthreshold leakage current $I_{sub}$ when the gate voltage Vg=Vcc.

The adjustable gate voltage may reduce (e.g., minimize) the total leakage current of the sleep transistor 102 during sleep mode (e.g., standby leakage) compared with prior techniques. The gate voltage provided by the voltage generator 108 may be controlled by a control circuit, such as a closed loop control circuit.

Figure 2:
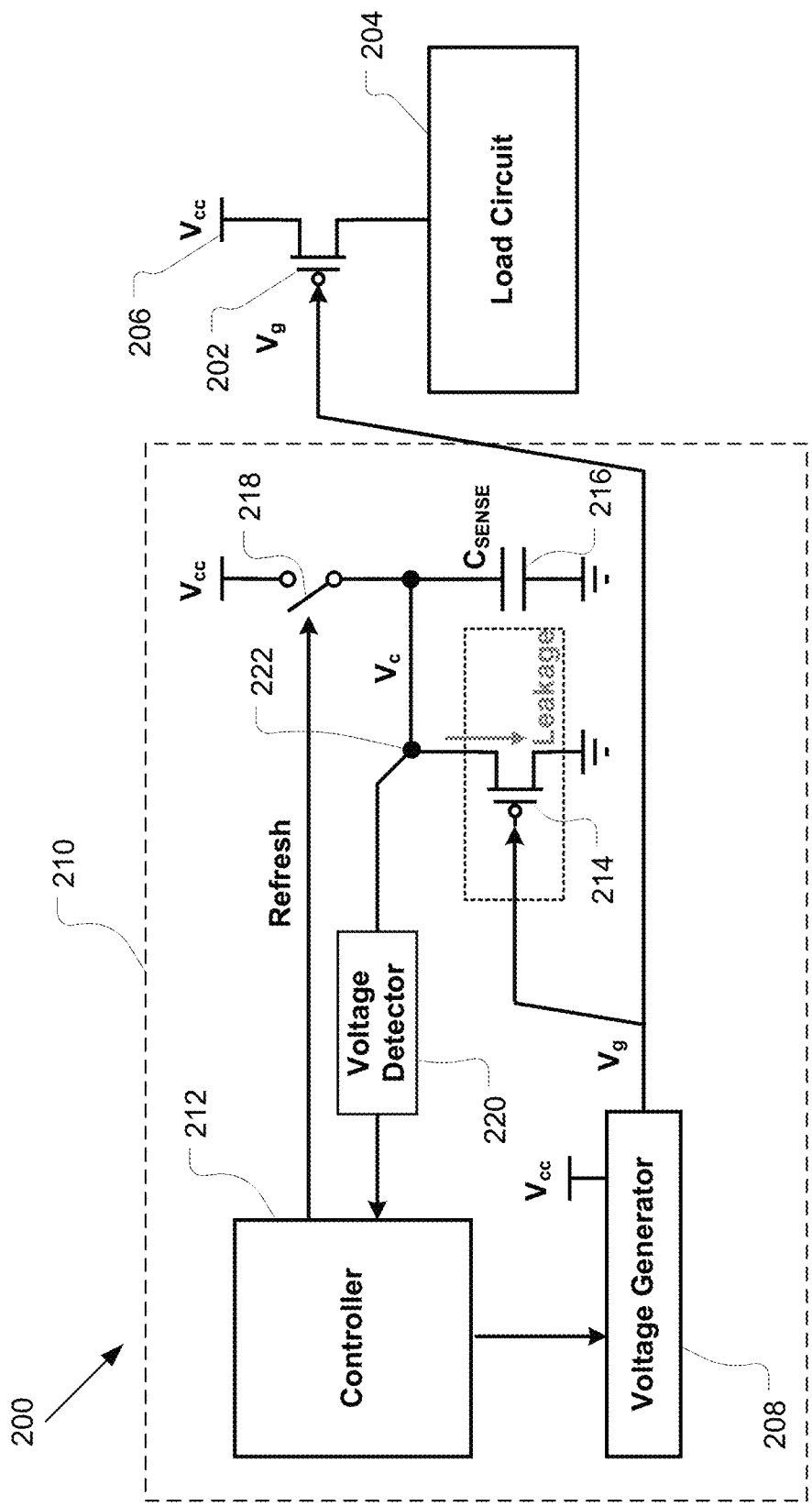
FIG. 2 illustrates a circuit including a sleep transistor coupled between a load circuit and a power supply rail, and a bias circuit to provide a calibrated gate voltage to the sleep transistor in the sleep mode, in accordance with various embodiments.

FIG. 2 illustrates one example of a circuit 200 including a bias circuit 210 to control a gate voltage Vg provided to a gate terminal of a sleep transistor 202 using a closed feedback loop, in accordance with various embodiments. The sleep transistor 202 may be coupled between a load circuit 204 and a power supply rail 206. The sleep transistor 202, load circuit 204, and power supply rail 206 may correspond to the sleep transistor 102, load circuit 104, and power supply rail 106 of circuit 100, in some embodiments.

The bias circuit 210 may include a voltage generator 208 and a controller 212 coupled to the voltage generator 208. The controller 212 may control the gate voltage generated by the voltage generator 208 using a closed control loop. For example, the bias circuit 210 may include a replica sleep transistor 214 with a gate terminal coupled to the voltage generator 208 to receive the same gate voltage that is provided to the sleep transistor 202. The replica sleep transistor 214 may represent the leakage current of the sleep transistor 202 for control of the gate voltage by the bias circuit 210. Accordingly, the replica sleep transistor 214 may be sized big enough to properly represent the leakage current of the sleep transistor 202, and may be tolerant against within-die variations.

The bias circuit 210 may further include a capacitor 216 (e.g., a shunt sense capacitor), a switch 218, and/or a voltage detector 220. The capacitor 216 and voltage detector 220 may be coupled to a source terminal of the replica sleep transistor 214 (e.g., at an internal node 222). The capacitor 216 may be coupled between the internal node 222 and ground. The voltage detector 220 may be coupled between the internal node 222 and the controller 212. The switch 218 may be coupled between the internal node 222 and the voltage supply rail 206 and controllable by the controller 212 (e.g., using a restore signal) to selectively charge the capacitor 216 to Vcc. The voltage detector 220 may detect when the voltage at the internal node 222 drops below a threshold voltage that is less than Vcc (e.g., Vcc–an offset voltage Δ). The voltage detector 220 may include any suitable circuitry/logic to perform the detection, such as a comparator to compare the voltage at the internal node 222 to the threshold voltage.

Figure 3:
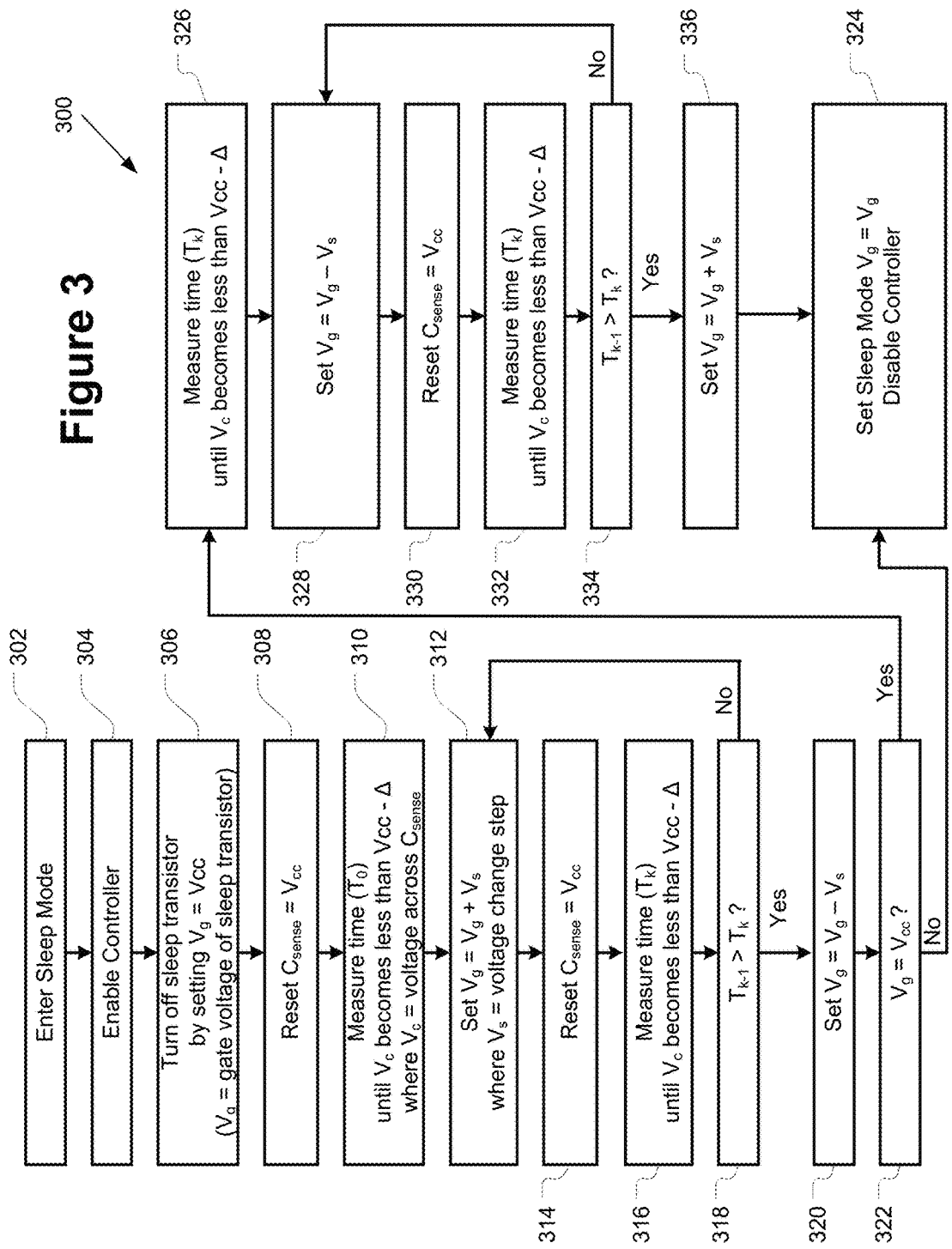
FIG. 3 is a flowchart of a process that may be performed by a bias circuit (e.g., the bias circuit of FIG. 2) to adjust the gate voltage that is provided to a sleep transistor (e.g., the sleep transistor of FIG. 2), in accordance with various embodiments.

FIG. 3 is a flowchart of a process 300 that may be performed by a bias circuit (e.g., the bias circuit 210 of FIG. 2) to adjust the gate voltage that is provided to a sleep transistor (e.g., the sleep transistor 202), in accordance with various embodiments. The process 300 will be described with reference to the circuit 200. However, it will be apparent that aspects or all of the process 300 may be practiced by other bias circuits.

At 302 of the process 300, the circuit 200 may enter the sleep mode. At 304, the controller 212 may be enabled. At 306, the sleep transistor 202 may be turned off by setting the gate voltage Vg to an initial value (e.g., the supply voltage Vcc).

The controller 212 then measures the leakage current through the replica sleep transistor 214 while sweeping the gate voltage generated by the voltage generator 208 to determine the desired value of the gate voltage. For example, at 308, the voltage stored by the capacitor 216 (e.g., the voltage at the internal node 222) may be reset to the supply voltage Vcc. The switch 218 may be closed responsive to the refresh signal and then opened again, while the capacitor 216 holds the voltage at the internal node 222.

At 310, the controller 212 may measure the time ($T_k$) until the voltage at the internal node 222 becomes less than Vcc minus an offset voltage Δ. In some embodiments, the value of the offset voltage Δ may be a programmable voltage. In some embodiments, the time $T_k$ may be measured by counting a number of clock cycles until the voltage at the internal node 222 becomes less than Vcc–Δ. The measured time may be inversely proportional to the leakage current of the replica sleep transistor 214.

In various embodiments, the controller 212 may, at 312, adjust the gate voltage by a voltage step Vs (e.g., Vg=Vcc+Vs) and then measure the leakage current through the replica sleep transistor 214 again. For example, at 314, the controller 212 may reset the voltage at the internal node 222 (e.g., as stored by the capacitor 216). At 316, the controller 212 may measure the time $T_k$ until the voltage at the internal node 222 becomes less than Vcc minus the offset voltage Δ. At 318, the controller may determine whether the time $T_{k-1}$ determined in the previous iteration (e.g., the time determined at 310 or the time determined at a previous iteration of block 316) is greater than the time $T_k$ determined for the present iteration (e.g., indicating that the prior iteration has a lower leakage current than the current iteration).

If, at block 318, it is determined that $T_{k-1}$ is less than (or not greater than) $T_k$, then the process 300 may return to block 312 to increase the gate voltage Vg by the voltage step Vs again and then re-measure the leakage current through the replica sleep transistor 214 according to blocks 314 and 316 before returning to block 318. If, at block 318, it is determined that $T_{k-1}$ is greater than $T_k$, then the process may move to block 320, at which the gate voltage is adjusted in the opposite direction from the adjustment made by block 312 (e.g., reduced by the voltage step Vs (Vg=Vcc–Vs)). Accordingly, the gate voltage Vg may be reset to the gate voltage from the previous iteration, which is associated with a lower leakage current (e.g., the measured time $T_{k-1}$).

At block 322 of the process 300, the controller 212 may determine whether the gate voltage Vg set by block 320 is equal to Vcc. If the gate voltage Vg is not equal to Vcc, then the controller 212 determines that it has identified the calibrated value of the gate voltage Vg. Accordingly, the controller 212 may, at block 324, set the sleep mode gate voltage Vg to be applied to the sleep transistor 202 during the sleep mode equal to the value set by block 320 (which corresponds to the value from the previous iteration that caused block 318 to determine that $T_{k-1}$ is greater than $T_k$). The controller 212 may then be disabled, and the voltage generator 208 may apply the determined value of the calibrated gate voltage Vg to the gate terminal of the sleep transistor 202 while the load circuit 204 is in the sleep mode.

However, if, at block 322, it is determined that the gate voltage Vg is equal to Vcc, then the controller still needs to check values of the gate voltage that are less than Vcc to determine the calibrated value of the gate voltage Vg. Accordingly, in that case, the process 300 proceeds to block 326, at which the controller 212 may measure the time until the voltage at the internal node 222 becomes less than Vcc minus the offset voltage Δ (e.g., for the value of the gate voltage Vg set by the block 320).

At block 328, the controller 212 may decrease the gate voltage Vg by the voltage step Vs (Vg=Vcc–Vs) and then measure the leakage current through the replica sleep transistor 214 again. For example, at 330, the controller 212 may reset the voltage at the internal node 222 to Vcc (e.g., as stored by the capacitor 216). At 332, the controller 212 may measure the time $T_k$ until the voltage at the internal node 222 becomes less than Vcc minus the offset voltage Δ. At 334, the controller 212 may determine whether the time $T_{k-1}$ determined in the previous iteration (e.g., the time determined at 326 or the time determined at a previous iteration of block 332) is greater than the time $T_k$ determined for the present iteration (e.g., indicating that the prior iteration has a lower leakage current than the current iteration).

If, at block 334, it is determined that $T_{k-1}$ is less than (or not greater than) $T_k$, then the process 300 may return to block 328 to decrease the gate voltage Vg by the voltage step Vs again and then re-measure the leakage current through the replica sleep transistor 214 according to blocks 330 and 332 before returning to block 334. If, at block 334, it is determined that $T_{k-1}$ is greater than $T_k$, then the controller 212 may determine that it has identified the calibrated gate voltage Vg as the gate voltage associated with the prior iteration that measured time $T_{k-1}$. Accordingly, the controller 212 may, at block 336, reset the gate voltage to the value from the prior iteration (e.g., by increasing the gate voltage Vg by the voltage step Vs). Then, at block 324, the controller 212 may set the sleep mode gate voltage Vg to be applied to the sleep transistor 202 during the sleep mode equal to the value set by block 336. The controller 212 may then be disabled, and the voltage generator 208 may apply the determined value of the calibrated gate voltage Vg to the gate terminal of the sleep transistor 202 while the load circuit 204 is in the sleep mode.

In some embodiments, the circuitry of controller 212 may be power gated (e.g., using another sleep transistor) and/or clock gated after the calibrated sleep mode gate voltage Vg is determined by process 300. In some embodiments, the controller 200 may be scheduled to wake up (e.g., power on) periodically (e.g., every few milliseconds) to recalibrate the sleep mode gate voltage Vg, since the leakage of the sleep transistor 202 and/or replica sleep transistor 214 may change over time, such as due to temperature variation and/or aging.

Figure 4:
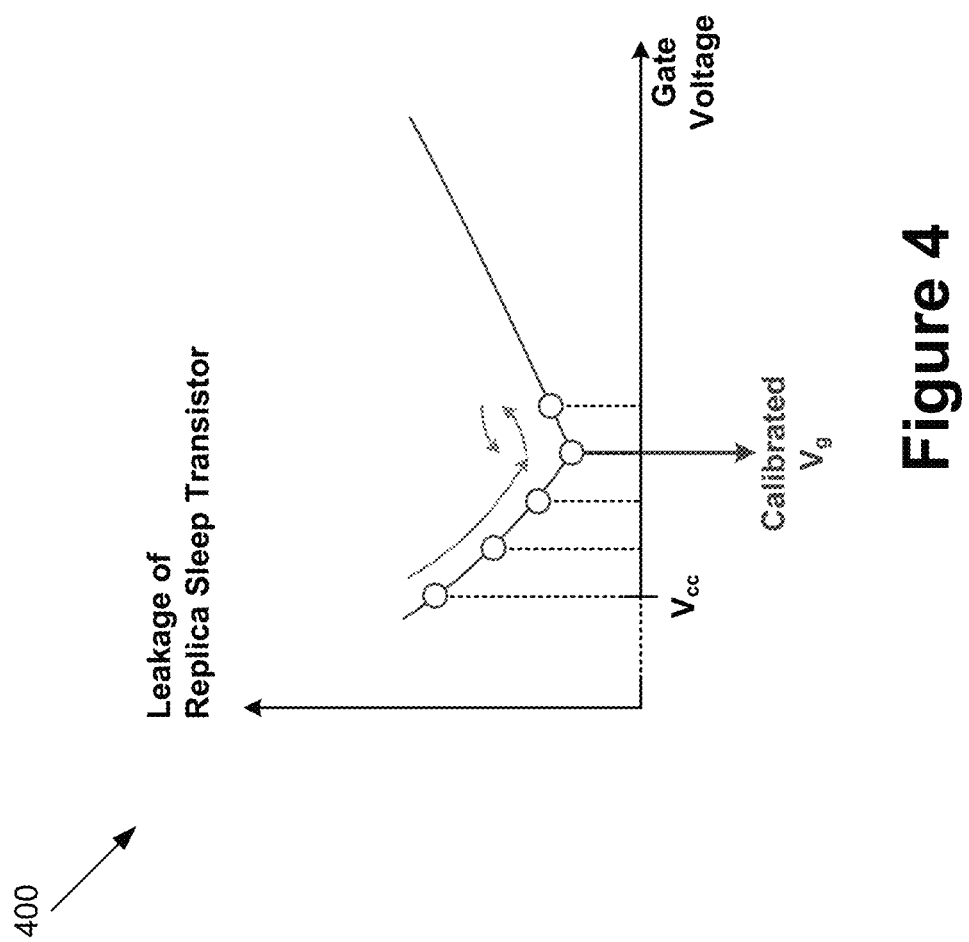
FIG. 4 illustrates a graphical representation of one example for how the calibrated sleep mode gate voltage may be determined by the process of FIG. 3, in accordance with various embodiments.

FIG. 4 illustrates a graphical representation 400 of one example for how the calibrated sleep mode gate voltage Vg may be determined by the process 300. Graphical representation 400 depicts the leakage current of the replica sleep transistor 214 at different values of the gate voltage Vg. As shown, the gate voltage may be iteratively increased from Vcc (e.g., by the voltage step Vs for each iteration). Since the leakage initially decreases, subsequent iterations continue to increase the gate voltage Vg until the leakage increases from one iteration to the next. When that occurs, the gate voltage from the prior iteration may be set as the calibrated sleep mode gate voltage Vg.

Although not shown in FIG. 4, a similar process occurs if the leakage initially increases for the first value of the gate voltage above Vcc compared with the leakage at Vcc. In that case, the gate voltage is then decreased below Vcc until the leakage increases from one iteration to the next. When that occurs, the gate voltage from the prior iteration (which may be Vcc or a value below Vcc) may be set as the calibrated sleep mode gate voltage Vg.

It will be apparent that in other embodiments of the process 300, the value of the gate voltage Vg may be first decreased below Vcc to check the values below Vcc for a calibrated value prior to increasing the gate voltage above Vcc to check for a calibrated value (e.g., if the calibrated value is not identified below Vcc).

In some embodiments, the calibrated sleep mode gate voltage Vg determined and/or generated by the circuit 100 and/or 200 may be shared by a plurality of sleep transistors on a same die (e.g., all of the sleep transistors). As discussed above, the voltage generator 108 and/or 208 may be on the same die as the sleep transistors and associated load circuits and/or on a different die. The voltage generator 108 and/or 208 may use any suitable circuitry to generate the calibrated voltage, such as a charge-pump to increase the gate voltage greater than Vcc and/or a switched-capacitor voltage reference (SCVR) circuit to decrease the gate voltage less than Vcc).

Figure 5:
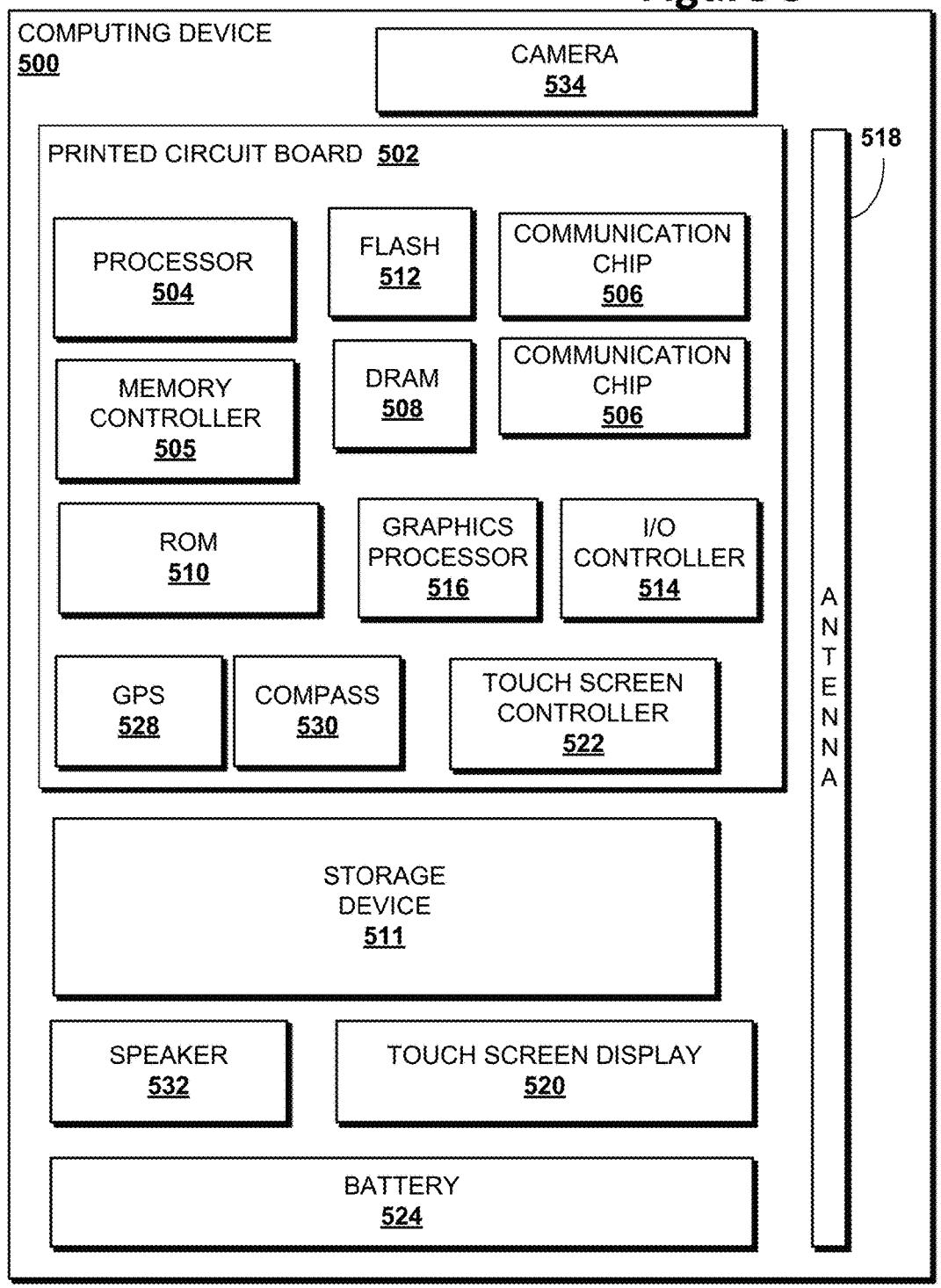
FIG. 5 illustrates an example system configured to employ the apparatuses and methods described herein, in accordance with various embodiments.

FIG. 5 illustrates an example computing device 500 that may employ the apparatuses and/or methods described herein (e.g., circuit 100, circuit 200, and/or process 300), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, memory controller 505, volatile memory (e.g., dynamic random access memory (DRAM) 508), non-volatile memory such as read only memory (ROM) 510, flash memory 512, storage device 511 (e.g., a hard-disk drive (HDD)), an I/O controller 514, a digital signal processor (not shown), a crypto processor (not shown), a graphics processor 516, one or more antenna 518, a display (not shown), a touch screen display 520, a touch screen controller 522, a battery 524, an audio codec (not shown), a video codec (not shown), a global positioning system (GPS) device 528, a compass 530, an accelerometer (not shown), a gyroscope (not shown), a speaker 532, a camera 534, and a mass storage device (such as hard disk drive, a solid state drive, compact disk (CD), digital versatile disk (DVD)) (not shown), and so forth. In various embodiments, the processor 504 may be integrated on the same die with other components to form a System on Chip (SoC).

In some embodiments, the one or more processor(s) 504, flash memory 512, and/or storage device 511 may include associated firmware (not shown) storing programming instructions configured to enable computing device 500, in response to execution of the programming instructions by one or more processor(s) 504, to practice all or selected aspects of the methods described herein (e.g., process 300). In various embodiments, these aspects may additionally or alternatively be implemented using hardware separate from the one or more processor(s) 504, flash memory 512, or storage device 511.

In various embodiments, one or more components of the computing device 500 may include the circuit 100 and/or 200 and/or implement the process 300 described herein. For example, the circuit 100 and/or 200 may be included in, and/or the process 300 may be implemented by, processor 504, communication chip 506, I/O controller 514, memory controller 505, and/or another component of computing device 500. The circuit 100 and/or 200 and/or implement the process 300 may be used to power gate one or more circuit blocks of the integrated circuit when the one or more circuit blocks are in a sleep mode, as described herein.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others. In some embodiments, the computing device 500 may be an internet of things (IoT) device with circuitry that may spend significant time in the sleep mode and may benefit from the embodiments described herein.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

Some non-limiting Examples of various embodiments are provided below.

Example 1 is a circuit comprising: a load circuit; a power rail to receive a supply voltage; a sleep transistor coupled between the load circuit and the power rail, the sleep transistor to be on in an active mode to provide the supply voltage to the load circuit, and to be off in a sleep mode to disconnect the load circuit from the power rail; and a bias circuit coupled to the sleep transistor to provide a calibrated gate voltage to a gate terminal of the sleep transistor during the sleep mode, wherein the bias circuit includes a replica sleep transistor. The bias circuit is to: measure a total leakage current of the replica sleep transistor at a plurality of voltage levels of a gate voltage provided to the replica sleep transistor, wherein the total leakage current includes a subthreshold leakage current and a gate-induced drain leakage (GIDL) current of the replica sleep transistor; and set the calibrated gate voltage to a calibrated voltage level that has a lowest measured total leakage current among the plurality of voltage levels.

Example 2 is the circuit of Example 1, wherein a source terminal of the replica sleep transistor is coupled to an internal node of the bias circuit, and wherein the bias circuit further includes: a capacitor coupled between the internal node and ground; a controller to charge the internal node to an initial voltage; and a voltage detector to detect when a voltage at the internal node falls below a threshold voltage; wherein the controller is to measure the total leakage current of the replica sleep transistor based on a time period that elapses for the voltage at the internal node to fall below the threshold voltage.

Example 3 is the circuit of Example 1, wherein the bias circuit is to adjust a voltage level of the gate voltage by a voltage step for successive measurements until the measured total leakage current for a first iteration is greater than the measured total leakage for a prior iteration.

Example 4 is the circuit of Example 1, wherein the bias circuit is to set the calibrated voltage level of the calibrated gate voltage to be greater than, equal to, or less than the supply voltage based on the total leakage current.

Example 5 is the circuit of Example 1, wherein the subthreshold leakage current is approximately equal to the GIDL current plus a junction leakage current of the replica sleep transistor at the calibrated gate voltage.

Example 6 is the circuit of Example 1, wherein the bias circuit is to provide the calibrated gate voltage to a plurality of sleep transistors of the circuit.

Example 7 is the circuit of Example 1, wherein the sleep transistor is a first sleep transistor, and wherein the circuit further comprises a second sleep transistor coupled between the bias circuit and the power supply rail to power gate circuitry of the bias circuit after the calibrated gate voltage is set.

Example 8 is the circuit of Example 1, wherein the bias circuit is to periodically reset the calibrated voltage level of the calibrated gate voltage during the sleep mode.

Example 9 is the circuit of Example 1, wherein the bias circuit is on a same integrated circuit die as the load circuit and the sleep transistor.

Example 10 is a bias circuit to provide a calibrated gate voltage to a sleep transistor during a sleep mode, the bias circuit comprising: a replica sleep transistor having a source terminal coupled to an internal node of the bias circuit; a voltage generator to provide a gate voltage to the replica sleep transistor and the sleep transistor; and a control circuit. The control circuit is to, for a plurality of voltage levels of the gate voltage: charge the internal node to an initial voltage; determine a time period that elapses for a voltage level at the internal node to fall to a threshold voltage that is less than the initial voltage; and set the calibrated gate voltage to a calibrated voltage level that is associated with a longest determined time period from among the plurality of voltage levels.

Example 11 is the bias circuit of Example 10, further comprising a capacitor coupled between the internal node and ground.

Example 12 is the bias circuit of Example 10, wherein the control circuit is coupled in a closed loop with the replica sleep transistor and the voltage generator to set the calibrated gate voltage to the calibrated voltage level.

Example 13 is the bias circuit of Example 10, wherein the time period is indicative of a total leakage current of the replica sleep transistor, and wherein the total leakage current includes a subthreshold leakage current, a gate-induced drain leakage (GIDL) current, and a junction leakage current of the replica sleep transistor.

Example 14 is the bias circuit of Example 10, wherein the bias circuit is to adjust a voltage level of the gate voltage by a voltage step for successive determinations of the time period until the determined time period for a first iteration is greater than the determined time period for a prior iteration, and wherein the voltage level associated with the prior iteration is the calibrated voltage level.

Example 15 is the bias circuit of Example 10, wherein the bias circuit is to adjust the calibrated voltage level within a range that includes a first voltage level that is greater than the supply voltage and a second voltage level that is less than the supply voltage.

Example 16 is the bias circuit of Example 10, wherein the subthreshold leakage current is approximately equal to the GIDL current plus the junction leakage current of the replica sleep transistor at the calibrated gate voltage.

Example 17 is the bias circuit of Example 10, wherein the bias circuit is to provide the calibrated gate voltage to a plurality of sleep transistors of the circuit.

Example 18 is a computer system comprising: a battery; one or more antennas; and a processor coupled to the battery and the one or more antennas. The processor includes: a logic circuit; a sleep transistor coupled between the logic circuit and a power supply rail to switch the logic circuit between an active mode and a sleep mode; and a bias circuit coupled to a gate terminal of the sleep transistor to calibrate a gate voltage provided to the gate terminal with a closed control loop that adjusts a voltage level of the calibrated gate voltage based on a total leakage current through a replica sleep transistor, wherein the total leakage current includes a subthreshold leakage current a gate-induced drain leakage (GIDL) current, and a junction leakage current of the replica sleep transistor.

Example 19 is the computer system of Example 18, wherein the replica sleep transistor has a source terminal coupled to an internal node of the bias circuit, and wherein the bias circuit further includes: a voltage generator to provide a gate voltage to the replica sleep transistor and the sleep transistor; and a control circuit. The control circuit is to, for a plurality of voltage levels of the gate voltage: charge the internal node to an initial voltage; determine a time period that has elapsed for a voltage level at the internal node to fall to a threshold voltage that is less than the initial voltage; and set the calibrated gate voltage to a calibrated voltage level that is associated with a longest determined time period from among the plurality of voltage levels.

Example 20 is the computer system of Example 18, wherein the bias circuit is to adjust the calibrated voltage level within a range that includes a first voltage level that is greater than the supply voltage and a second voltage level that is less than the supply voltage.

Example 21 is the computer system of Example 18, wherein the subthreshold leakage current is approximately equal to the GIDL current plus the junction leakage current of the replica sleep transistor at the calibrated gate voltage.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
   a load circuit;
   a power rail to receive a supply voltage;
   a sleep transistor coupled between the load circuit and the power rail, the sleep transistor to be on in an active mode to provide the supply voltage to the load circuit, and to be off in a sleep mode to disconnect the load circuit from the power rail; and
   a bias circuit coupled to the sleep transistor to provide a calibrated gate voltage to a gate terminal of the sleep transistor during the sleep mode, wherein the bias circuit includes a replica sleep transistor and is to:
      measure a total leakage current of the replica sleep transistor at a plurality of voltage levels of a gate voltage provided to the replica sleep transistor, wherein the total leakage current includes a subthreshold leakage current and a gate-induced drain leakage (GIDL) current of the replica sleep transistor; and
      set the calibrated gate voltage to a calibrated voltage level that has a lowest measured total leakage current among the plurality of voltage levels, wherein the subthreshold leakage current is approximately equal to the GIDL current plus a junction leakage current of the replica sleep transistor at the calibrated gate voltage.

2. The circuit of claim 1, wherein a source terminal of the replica sleep transistor is coupled to an internal node of the bias circuit, and wherein the bias circuit further includes:
   a capacitor coupled between the internal node and ground;
   a controller to charge the internal node to an initial voltage; and
   a voltage detector to detect when a voltage at the internal node falls below a threshold voltage;
   wherein the bias circuit is to measure the total leakage current of the replica sleep transistor based on a time period that elapses for the voltage at the internal node to fall below the threshold voltage.

3. The circuit of claim 1, wherein the bias circuit is to adjust a voltage level of the gate voltage by a voltage step for successive measurements until the measured total leakage current for a first iteration is greater than the measured total leakage current for a prior iteration.

4. The circuit of claim 1, wherein the bias circuit is to set the calibrated voltage level of the calibrated gate voltage to be greater than, equal to, or less than the supply voltage based on the total leakage current.

5. The circuit of claim 1, wherein the bias circuit is to provide the calibrated gate voltage to a plurality of sleep transistors of the circuit.

6. The circuit of claim 1, wherein the sleep transistor is a first sleep transistor, and wherein the circuit further comprises a second sleep transistor coupled between the bias circuit and the power rail to power gate circuitry of the bias circuit after the calibrated gate voltage is set.

7. The circuit of claim 1, wherein the bias circuit is to periodically reset the calibrated voltage level of the calibrated gate voltage during the sleep mode.

8. The circuit of claim 1, wherein the bias circuit is on a same integrated circuit die as the load circuit and the sleep transistor.

9. A bias circuit to provide a calibrated gate voltage to a sleep transistor during a sleep mode, the bias circuit comprising:
   a replica sleep transistor having a source terminal coupled to an internal node of the bias circuit;
   a voltage generator to provide a gate voltage to the replica sleep transistor and the sleep transistor; and
   a control circuit to, for a plurality of voltage levels of the gate voltage:
      charge the internal node to an initial voltage;
      determine a time period that elapses for a voltage level at the internal node to fall to a threshold voltage that is less than the initial voltage; and
      set the calibrated gate voltage to a calibrated voltage level that is associated with a longest determined time period from among the plurality of voltage levels.

10. The bias circuit of claim 9, further comprising a capacitor coupled between the internal node and ground.

11. The bias circuit of claim 9, wherein the control circuit is coupled in a closed loop with the replica sleep transistor and the voltage generator to set the calibrated gate voltage to the calibrated voltage level.

12. The bias circuit of claim 9, wherein the time period is indicative of a total leakage current of the replica sleep transistor, and wherein the total leakage current includes a subthreshold leakage current, a gate-induced drain leakage (GIDL) current, and a junction leakage current of the replica sleep transistor.

13. The bias circuit of claim 9, wherein the bias circuit is to adjust a voltage level of the gate voltage by a voltage step for successive determinations of the time period until the determined time period for a first iteration is greater than the determined time period for a prior iteration, and wherein the voltage level associated with the prior iteration is the calibrated voltage level.

14. The bias circuit of claim 9, wherein the bias circuit is to adjust the calibrated voltage level within a range that includes a first voltage level that is greater than a supply voltage and a second voltage level that is less than the supply voltage.

15. The bias circuit of claim 9, wherein a subthreshold leakage current of the replica sleep transistor is approximately equal to a GIDL current plus a junction leakage current of the replica sleep transistor at the calibrated gate voltage.

16. The bias circuit of claim 9, wherein the bias circuit is to provide the calibrated gate voltage to a plurality of sleep transistors of the circuit.

17. A computer system comprising:
a battery;
one or more antennas; and
a processor coupled to the battery and the one or more antennas, the processor including:
  a logic circuit;
  a sleep transistor coupled between the logic circuit and a power supply rail to switch the logic circuit between an active mode and a sleep mode; and
  a bias circuit coupled to a gate terminal of the sleep transistor to calibrate a gate voltage provided to the gate terminal with a closed control loop that adjusts a voltage level of the calibrated gate voltage based on a total leakage current through a replica sleep transistor, wherein the total leakage current includes a subthreshold leakage current a gate-induced drain leakage (GIDL) current, and a junction leakage current of the replica sleep transistor, wherein the subthreshold leakage current is approximately equal to the GIDL current plus the junction leakage current of the replica sleep transistor at the calibrated gate voltage.

18. The computer system of claim 17, wherein the replica sleep transistor has a source terminal coupled to an internal node of the bias circuit, and wherein the bias circuit further includes:
a voltage generator to provide a gate voltage to the replica sleep transistor and the sleep transistor; and
a control circuit to, for a plurality of voltage levels of the gate voltage:
  charge the internal node to an initial voltage;
  determine a time period that has elapsed for a voltage level at the internal node to fall to a threshold voltage that is less than the initial voltage; and
  set the calibrated gate voltage to a calibrated voltage level that is associated with a longest determined time period from among the plurality of voltage levels.

19. The computer system of claim 17, wherein the bias circuit is to adjust the calibrated gate voltage within a range that includes a first voltage level that is greater than a supply voltage, of the power supply rail, and a second voltage level that is less than the supply voltage.

20. A circuit comprising:
a load circuit;
a power rail to receive a supply voltage;
a sleep transistor coupled between the load circuit and the power rail, the sleep transistor to be on in an active mode to provide the supply voltage to the load circuit, and to be off in a sleep mode to disconnect the load circuit from the power rail; and
a bias circuit coupled to the sleep transistor to provide a calibrated gate voltage to a gate terminal of the sleep transistor during the sleep mode, wherein the bias circuit includes:
  a replica sleep transistor with a source terminal coupled to an internal node of the bias circuit;
  a capacitor coupled between the internal node and ground;
  a controller to charge the internal node to an initial voltage; and
  a voltage detector to detect when a voltage at the internal node falls below a threshold voltage;
wherein the bias circuit is to:
  measure a total leakage current of the replica sleep transistor at a plurality of voltage levels of a gate voltage provided to the replica sleep transistor, wherein the total leakage current includes a subthreshold leakage current and a gate-induced drain leakage (GIDL) current of the replica sleep transistor, wherein the controller is to measure the total leakage current of the replica sleep transistor based on a time period that elapses for the voltage at the internal node to fall below the threshold voltage; and
  set the calibrated gate voltage to a calibrated voltage level that has a lowest measured total leakage current among the plurality of voltage levels.

21. The circuit of claim 20, wherein the bias circuit is to adjust a voltage level of the gate voltage by a voltage step for successive measurements until the measured total leakage current for a first iteration is greater than the measured total leakage current for a prior iteration.

22. The circuit of claim 20, wherein the bias circuit is to set the calibrated voltage level of the calibrated gate voltage to be greater than, equal to, or less than the supply voltage based on the total leakage current.

23. The circuit of claim 20, wherein the bias circuit is to provide the calibrated gate voltage to a plurality of sleep transistors of the circuit.

24. The circuit of claim 20, wherein the sleep transistor is a first sleep transistor, and wherein the circuit further comprises a second sleep transistor coupled between the bias circuit and the power rail to power gate circuitry of the bias circuit after the calibrated gate voltage is set.

25. The circuit of claim 20, wherein the bias circuit is to periodically reset the calibrated voltage level of the calibrated gate voltage during the sleep mode.

26. The circuit of claim 20, wherein the bias circuit is on a same integrated circuit die as the load circuit and the sleep transistor.

27. A circuit comprising:
a load circuit;
a power rail to receive a supply voltage;
a sleep transistor coupled between the load circuit and the power rail, the sleep transistor to be on in an active mode to provide the supply voltage to the load circuit, and to be off in a sleep mode to disconnect the load circuit from the power rail; and
a bias circuit coupled to the sleep transistor to provide a calibrated gate voltage to a gate terminal of the sleep transistor during the sleep mode, wherein the bias circuit includes a replica sleep transistor and is to:
  measure a total leakage current of the replica sleep transistor at a plurality of voltage levels of a gate voltage provided to the replica sleep transistor, wherein the total leakage current includes a subthreshold leakage current and a gate-induced drain leakage (GIDL) current of the replica sleep transistor;
  set the calibrated gate voltage to a calibrated voltage level that has a lowest measured total leakage current among the plurality of voltage levels; and periodically reset the calibrated voltage level of the calibrated gate voltage during the sleep mode.

28. The circuit of claim 27, wherein the bias circuit is to adjust a voltage level of the gate voltage by a voltage step for successive measurements until the measured total leakage current for a first iteration is greater than the measured total leakage current for a prior iteration.

29. The circuit of claim 27, wherein the bias circuit is to set the calibrated voltage level of the calibrated gate voltage to be greater than, equal to, or less than the supply voltage based on the total leakage current.

30. The circuit of claim 27, wherein the bias circuit is to provide the calibrated gate voltage to a plurality of sleep transistors of the circuit.

31. The circuit of claim 27, wherein the sleep transistor is a first sleep transistor, and wherein the circuit further comprises a second sleep transistor coupled between the bias circuit and the power rail to power gate circuitry of the bias circuit after the calibrated gate voltage is set.

32. A computer system comprising:
a battery;
one or more antennas; and
a processor coupled to the battery and the one or more antennas, the processor including:
  a logic circuit;
  a sleep transistor coupled between the logic circuit and a power supply rail to switch the logic circuit between an active mode and a sleep mode; and
  a bias circuit coupled to a gate terminal of the sleep transistor to calibrate a gate voltage provided to the gate terminal with a closed control loop that adjusts a voltage level of the calibrated gate voltage based on a total leakage current through a replica sleep transistor, wherein the total leakage current includes a subthreshold leakage current, a gate-induced drain leakage (GIDL) current, and a junction leakage current of the replica sleep transistor;
  wherein the replica sleep transistor has a source terminal coupled to an internal node of the bias circuit, and wherein the bias circuit further includes:
    a voltage generator to provide a gate voltage to the replica sleep transistor and the sleep transistor; and
    a control circuit to, for a plurality of voltage levels of the gate voltage:
      charge the internal node to an initial voltage;
      determine a time period that has elapsed for a voltage level at the internal node to fall to a threshold voltage that is less than the initial voltage; and
      set the calibrated gate voltage to a calibrated voltage level that is associated with a longest determined time period from among the plurality of voltage levels.

33. The computer system of claim 32, wherein the bias circuit is to adjust the calibrated voltage level within a range that includes a first voltage level that is greater than a supply voltage and a second voltage level that is less than the supply voltage.

* * * * *